United States Patent
Tomita et al.

(10) Patent No.: US 6,856,553 B2
(45) Date of Patent: Feb. 15, 2005

(54) FLASH MEMORY WITH SHORTENED ERASING OPERATION TIME

(75) Inventors: Junji Tomita, Kawasaki (JP); Kazuhide Kurosaki, Kawasaki (JP); Takuo Ito, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 24 days.

(21) Appl. No.: 10/636,551

(22) Filed: Aug. 8, 2003

(65) Prior Publication Data

US 2004/0027886 A1 Feb. 12, 2004

(30) Foreign Application Priority Data

Aug. 8, 2002 (JP) ......................................... 2002-231450

(51) Int. Cl.[7] .............................................. G11C 16/00
(52) U.S. Cl. ............................... 365/185.29; 365/185.22
(58) Field of Search ........................ 365/185.29, 185.28, 365/185.22, 185.11, 189.04

(56) References Cited

U.S. PATENT DOCUMENTS

| | | | | |
|---|---|---|---|---|
| 5,748,528 A | * | 5/1998 | Campardo et al. | 365/185.13 |
| 5,847,994 A | * | 12/1998 | Motoshima et al. | 365/185.11 |
| 5,949,716 A | * | 9/1999 | Wong et al. | 365/185.29 |
| 6,088,264 A | * | 7/2000 | Hazen et al. | 365/185.11 |
| 6,345,000 B1 | * | 2/2002 | Wong et al. | 365/185.29 |
| 6,469,928 B2 | * | 10/2002 | Takata | 365/185.04 |

* cited by examiner

*Primary Examiner*—Tan T. Nguyen
(74) *Attorney, Agent, or Firm*—Arent Fox PLLC

(57) ABSTRACT

A flash memory having a nonvolatile memory cell, includes a plurality of banks each having a plurality of sectors, an erasing voltage generator circuit and a writing voltage generator circuit, wherein while an applying an erase pulse to a sector to be erased in a first bank, an erasing control is performed by, a pre-writing control is concurrently performed by applying a writing pulse to a sector to be erased in a second bank.

At the time when erasing control of the sector to be erased in a first bank is finished, pre-writing control of the sector to be erased in a second bank is finished or partially finished, and thus the time required for erasing operations of the first and the second bank can be reduced.

12 Claims, 9 Drawing Sheets

FLOW CHART OF ERASE OPERATION (1)

FLASH MEMORY WITH SHORTENED ERASING OPERATION TIME

CROSS-REFERENCE TO RELATED APPLICATIONS

This application is based upon and claims the benefit of priority from the prior Japanese Patent Application No. 2002-231450, filed on Aug. 8, 2002, the entire contents of which are incorporated herein by reference.

BACKGROUND OF THE INVENTION

1. Field of the Invention

The present invention relates generally to a flash memory comprised of a plurality of banks, and more particularly to a flash memory having a shortened erasing operation time.

2. Description of the Related Art

Flash memories, or semiconductor nonvolatile memories, can hold data even when the power is off, and are widely used in mobile telephones, mobile information terminals, digital cameras, etc., that require power saving. In the conventional flash memories, the memory core comprising the memory cell array and decoder does not employ a configuration of a plurality of banks, and during data writing operation or erasing operation, reading operation cannot be effected even on memory cells that are not subject to writing or erasing operation. Therefore, it was common for a read-out request not to be accepted during writing or erasing operation.

On the other hand, flash memories with a configuration including a plurality of banks have recently been proposed. These flash memories have a plurality of banks, each of which has a memory cell array and a decoder, and even during writing or erasing operation to one of the banks, read-out operation to the memory cell in another bank can be performed. This is because these flash memories are called dual operation flash memories.

FIG. 1 is a diagram showing a configuration of a conventional dual operation flash memory. This flash memory has four banks BNKA–BNKD, and each of the banks has a decoder for decoding an address entered from the outside and a memory cell array in its inside, not shown in the figure. In the memory cell array, a memory cell transistor having a floating gate or a trap gate is disposed in a matrix-like manner. A state machine 10 controls each of reading-out, writing, and erasing operations. A pump circuit PNP generates a boosted voltage during writing operations, or a boosted voltage and a negative voltage during erasing operation, and supplies these generated voltages to the selected bank.

In read-out operation, an address from the outside, not shown in the figure, is supplied to the selected bank, and the memory cell to be read is selected. In response to a read-out select signal RSEL from the state machine 10, a selector 12 supplies a read-out signal from the selected bank to a read sense amplifier RSA, and the read output RSAOUT detected there is outputted from the read sense amplifier RSA.

On the contrary, in writing operation, a boosted voltage for writing is applied to a memory cell in the selected bank, and writing operation is performed to the specified memory cell. During write verification, a selector 14 supplies a verify read-out signal from the memory cell to a verify sense amplifier VSA, in response to a write select signal WSEL from the state machine 10, and a verify sense amplifier VSA verifies writing, in response to a verify control signal VERIFY, and outputs a verify output VSAOUT.

In erasing operation, pre-writing is performed to a memory cell in an erased state of data 1, such that the memory cell is changed into a programming state of data 0, and furthermore, an erasing pulse is applied to all memory cells in the sector to be erased, such that all memory cells are changed into the erased state of data 1. In the operation, the pump circuit PNP supplies a writing voltage or an erasing voltage to an appropriate bank, and further, in each of the writing operation and the erasing operation, corresponding verify operation is performed. In other words, a series of erasing operations comprise pre-writing step, its program verify step, erasing pulse application step, over erase correct verify step after the application, over erase correct step, and erase verify step. Therefore, during verify operation, an address for verification is generated from an address generator circuit ADG, and supplied to the selected bank.

FIG. 2 is a diagram for showing an example of chip erasing operations in the conventional flash memory shown in FIG. 1. If all of the four banks in the chip are to be erased, in erasing operation, first of all, pre-writing is performed to the bank A, the bank B, the bank C, and the bank D, in that order. In short, writing is performed to the memory cell, which is in the erased state and located in each bank, Such that the memory cell is changed into a programming state. After pre-writing to all the banks is finished, an erasing pulse is applied to the sectors in each bank, and all memory cells in the programming state are changed into the erased state.

Thus, in erasing operation, pre-writing is performed to the memory cells in the sector inside the bank to be erased, and a batch erasing is performed sequentially to the sector in the bank to be erased. As described above, erasing operation comprises pre-writing step on a memory cell-by-memory cell basis, and erasing step on a sector-by-sector basis, thus the time required for erasing operation tends to be longer. For example, erasing a sector having a capacity of 64 K bytes takes, for example several seconds, and therefore, when a plurality of sectors in the bank are erased, or all banks in the chip are erased, the erasing time becomes longer because of the extra time required for these erasing operations, thus causing performance of the system to be lowered.

SUMMARY OF THE INVENTION

It is therefore the object of the present invention to provide a flash memory having a shortened erasing operation time.

In order to achieve the above object, according to a first aspect of the present invention there is provided a flash memory having a nonvolatile memory cell, comprising a plurality of banks each having a plurality of sectors, an erasing voltage generator circuit and a writing voltage generator circuit, wherein while an erasing control is performed by applying an erase pulse to a sector to be erased in a first bank, a pre-writing control is concurrently performed by applying a write pulse to a sector to be erased in a second bank.

According to the aspect of the present invention, out of pre-writing and erasing required for erasing operation, pre-writing control is performed simultaneously with erasing control of another bank. At the time when erasing control of the sector to be erased in a first bank is finished, pre-writing control of the sector to be erased in a second bank is finished or partially finished, and thus the time required for erasing operations of the first and the second bank can be reduced.

In the aspect of the present invention, the flash memory according to a preferred embodiment further comprises a sense amplifier for verification, and wherein in the pre-writing control, the application of the writing pulse and subsequent verification are sequentially effected on the memory cell. The pre-writing control in the second bank is interrupted, when verification after the application of the erasing pulse is performed in the sector to be erased in the first bank, during the pre-writing control in the sector to be erased in the second bank. More specifically, while an erasing pulse is applied to the first bank, the application of a pre-writing pulse and the subsequent verification are sequentially effected on the memory cell of the sector to be erased in the second bank, and when verification is performed after the application of an erasing pulse in the first bank, the verification at the sector to be erased in the second bank is interrupted, and hence, pre-writing control is also interrupted. Therefore, even if a common verify sense amplifier is employed, erasing control and pre-writing control of erasing operation can be performed in parallel.

Generally, the application time of a writing pulse is some one-digit shorter than the application time of an erasing pulse. Therefore, while an erasing pulse is being applied, that takes a very long time, the application of a writing pulse and verification after the application are performed to the memory cell in another bank, so that a common verify sense amplifier can be used effectively.

In the aspect of the present invention, according to a preferred embodiment, after erasing control in the first bank is complete, erasing control starts in the sector to be erased in the second bank, for which pre-writing has been finished. During the application of an erasing pulse that takes a longer time in the first bank, pre-writing control is performed in the second bank together with the application of a writing pulse that takes a shorter time. Hence, in many cases, pre-writing control in the second bank is complete while erasing control in the first bank is still being performed. However, erasing controls in different banks are not performed in parallel.

BRIEF DESCRIPTION OF THE DRAWINGS

The above and other objects, aspects, features and advantages of the present invention will become more apparent from the following detailed description when taken in conjunction with the accompanying drawings, in which.

DESCRIPTION OF THE PREFERRED EMBODIMENTS

Preferred embodiments of the present invention will now be described with reference to the accompanying drawings.

It is however to be appreciated that the protective range of the present invention is not limited to the following embodiments but extends to the inventions as defined in claims and to their equivalents.

Figure 3:
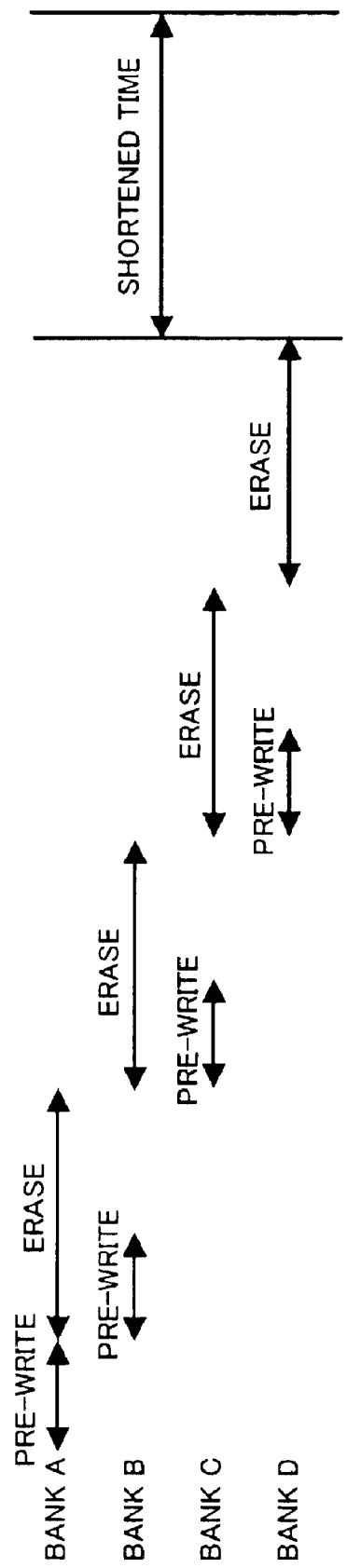
FIG. 3 is a schematic timing chart of chip erasing operations in an embodiment of the present invention.

FIG. 3 is a schematic timing chart of chip erasing operations in this embodiment. If erasing operation is performed to the banks A, B, C and D in that order, first pre-writing control of the bank A is performed, and a cell transistor in all sectors in the bank A is put into a written state (or a program state). In short, the written state means the state where an electron is injected into the floating gate or trap gate of the cell transistor, so that the threshold value is high. Next, erasing control is performed while an erasing pulse is applied to the sector in the bank A. At this time, pre-writing control is performed to the sector in the bank B, in parallel with erasing control of the bank A. To be more precise, while an erasing pulse is being applied to the sector in the bank A, a programming pulse is sequentially applied to the cell transistor in the erased state which is located in the sector in the bank B, and verify operation confirms that the erased state is changed to the written state. However, when the verify operation after the erasing pulse application is performed in the bank A, pre-writing control in the bank B is interrupted.

As the application time of an erasing pulse is relatively longer than that of a programming pulse, in many cases, pre-writing control in the bank B is finished, during erasing control of the bank A involving the application of an erasing pulse. However, since pre-writing control in the bank B requires a long time, if there are many number of the cell transistors in the erased state in the bank B, which are; pre-writing control in bank B may not be finished during erasing control of the bank A in some cases. Once erasing control of the bank A is finished, and all cell transistors turned to the erased state, then, erasing control to the bank B starts. If pre-writing control of the bank B is not finished during erasing control of the bank A, the erasing control of the bank B starts after the pre-writing control of the bank B is finished. In parallel with the erasing control of the bank B, pre-writing control to the next bank C starts. This erasing control of the bank B and pre-writing control of the bank C are performed in parallel, in the same way as described above.

Figure 1:
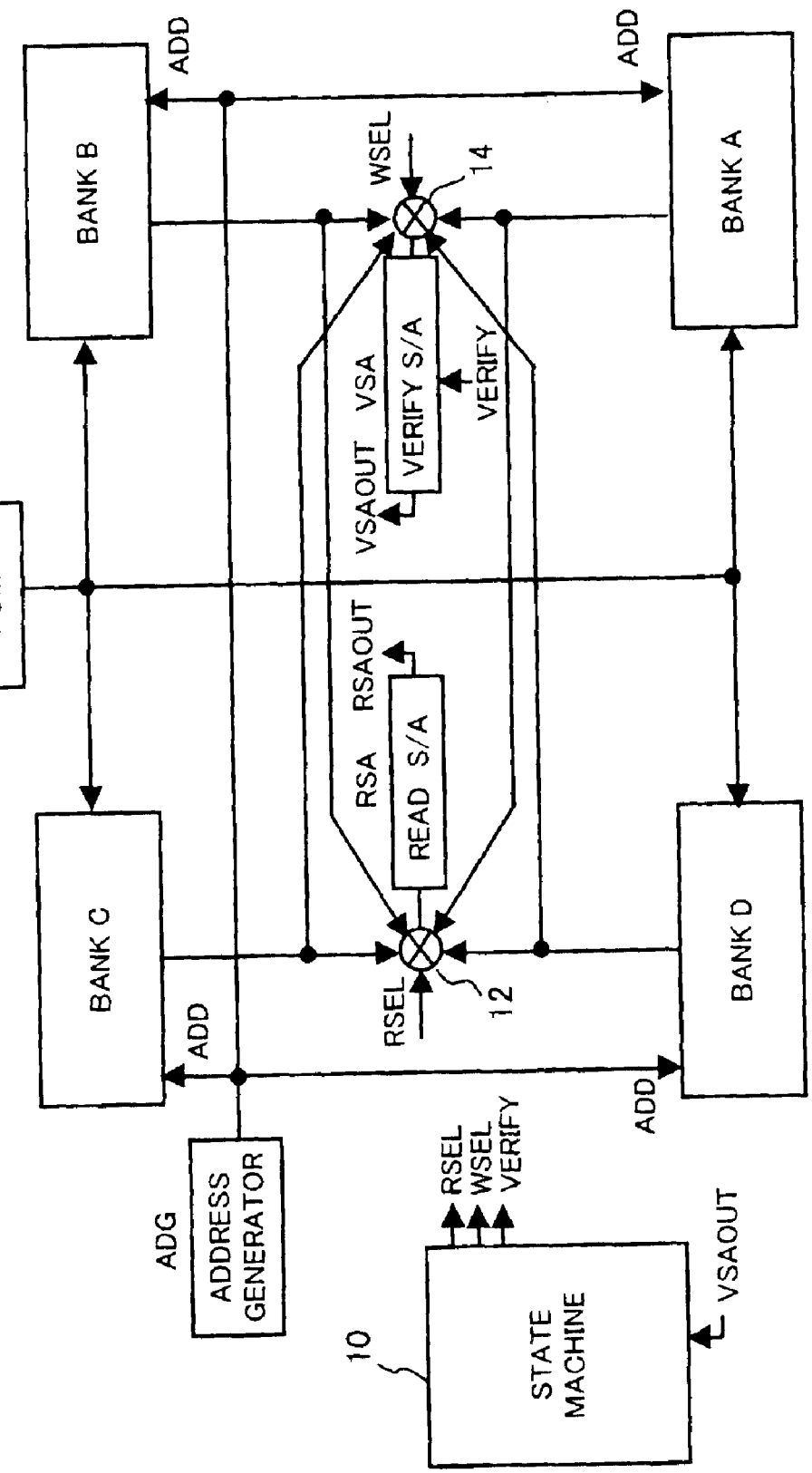
FIG. 1 is a diagram showing a configuration of the conventional dual operation flash memory.
Figure 2:
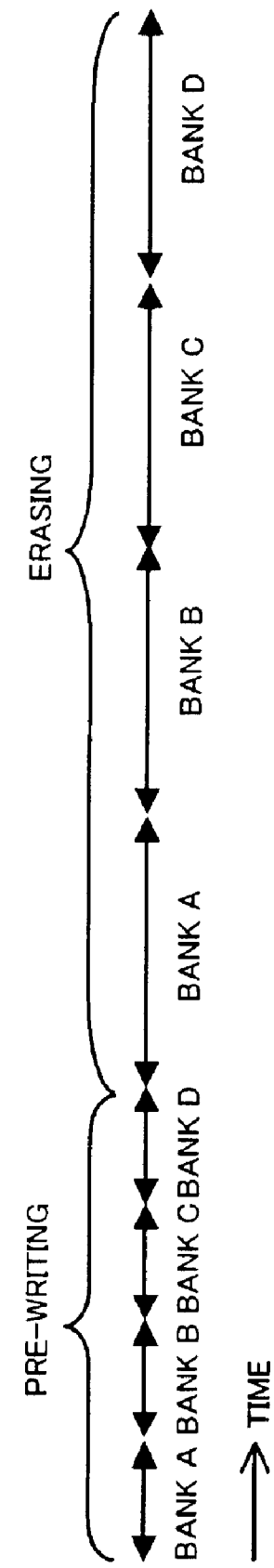
FIG. 2 is a diagram showing an example of chip erasing operations of the conventional flash memory shown in FIG. 1.

As shown in FIG. 3, in erasing operation according to the present embodiment, since pre-writing of the banks B, C, and D is performed in parallel during erasing control of the banks A, B, and C, respectively, the time required for pre-writing of the banks B, C, and D is saved compared to the conventional example shown in FIG. 2.

Figure 4:
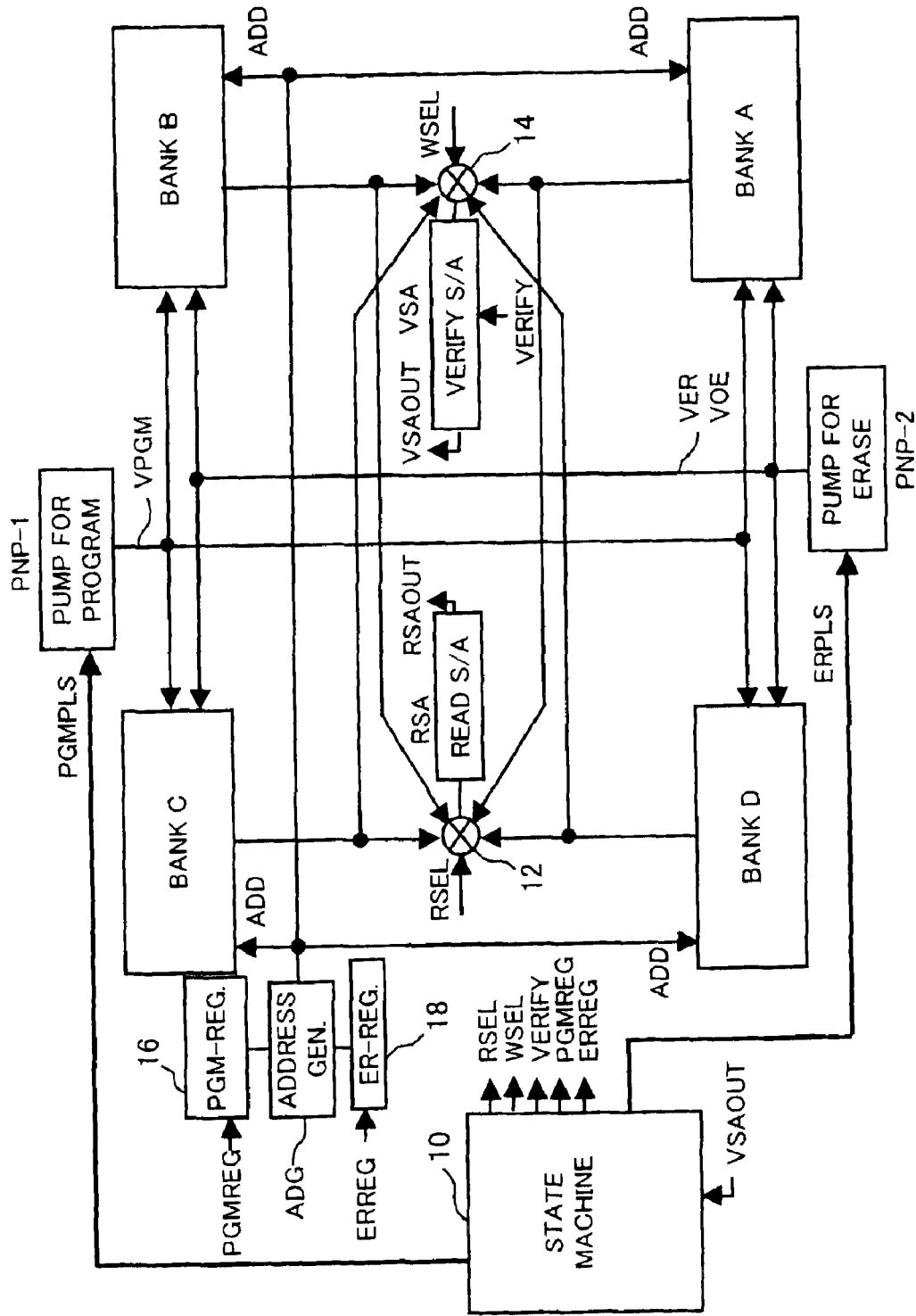
FIG. 4 is a diagram showing a configuration of the flash memory comprised of four banks in the embodiment.

FIG. 4 is a diagram showing a configuration of flash memory comprising four banks in an embodiment according to the present invention. Each of the four banks BNKA-BNKD has a plurality of sectors in its inside, and each of the sectors comprises a cell array having a plurality of cell transistors, and a decoder for selecting a word line or bit line located in the cell array. The output of the individual banks is connected to a read sense amplifier RSA through a selector 12, and also connected to a verify sense amplifier VSA through a selector 14.

As previously described, the cell transistor has a floating gate or a trap gate on a channel area between a drain and source through an insulator film, and further includes a control gate on the floating gate or trap gate through an insulator film. Each control gate is connected to the word line, and the source is connected to the source line, and the drain is connected to the bit line, respectively.

The state where an electron is not injected to the floating gate or trap gate is the erased state, or the state of data 1, and in this state, the threshold voltage is low. The state where an electron is injected into the floating gate or trap gate is the writing state or the programming state, or the state of data 0, and in this state, the threshold voltage is high.

A pump circuit for generating a boosted voltage comprises a programming pump circuit PNP-1 for generating a programming voltage VPGM during writing, and an erasing pump circuit PNP-2 for generating an erasing voltage VER during erasing, and an over erase correct voltage VOE. Each of the pump circuits supplies the specific generated voltage to the selected bank, in response to a program pulse control signal PGMPLS and an erasing pulse control signal ERPLS sent from the state machine 10, that is a control machine.

An address generator circuit ADG generates an address required for each verify operation in pre-writing control and erasing control. However, according to the present embodiment, when, during pre-writing control in one bank, over erase correct and verify operations after the application of an erasing pulse in another bank (over erase correct verify, and further erase verify operations) are performed, the pre-writing control is interrupted, and the address therefore need to be stored temporally. For this purpose, a programming register 16 is provided. The address in the address generator circuit ADG is stored in the programming register 16, in response to a program register signal PGMREG sent from the state machine 10.

During erasing control, since the application of an erasing pulse, and erasing verify are repeatedly performed alternately, the address used in the erasing verify is also stored during the application of an erasing pulse, such that pre-writing control in another bank can be made during the application of an erasing pulse. For this purpose, an erasing register 18 is provided, and the address in the address generator circuit ADG is stored in the erasing register 18, in response to an erasing register signal ERREG sent from the state machine 10.

The addresses stored in both of the registers 16 and 18 are returned to the address generator circuit ADG when pre-writing control restarts, or when the application of an erasing pulse restarts, and incremented again together with verify operation.

Figure 5:
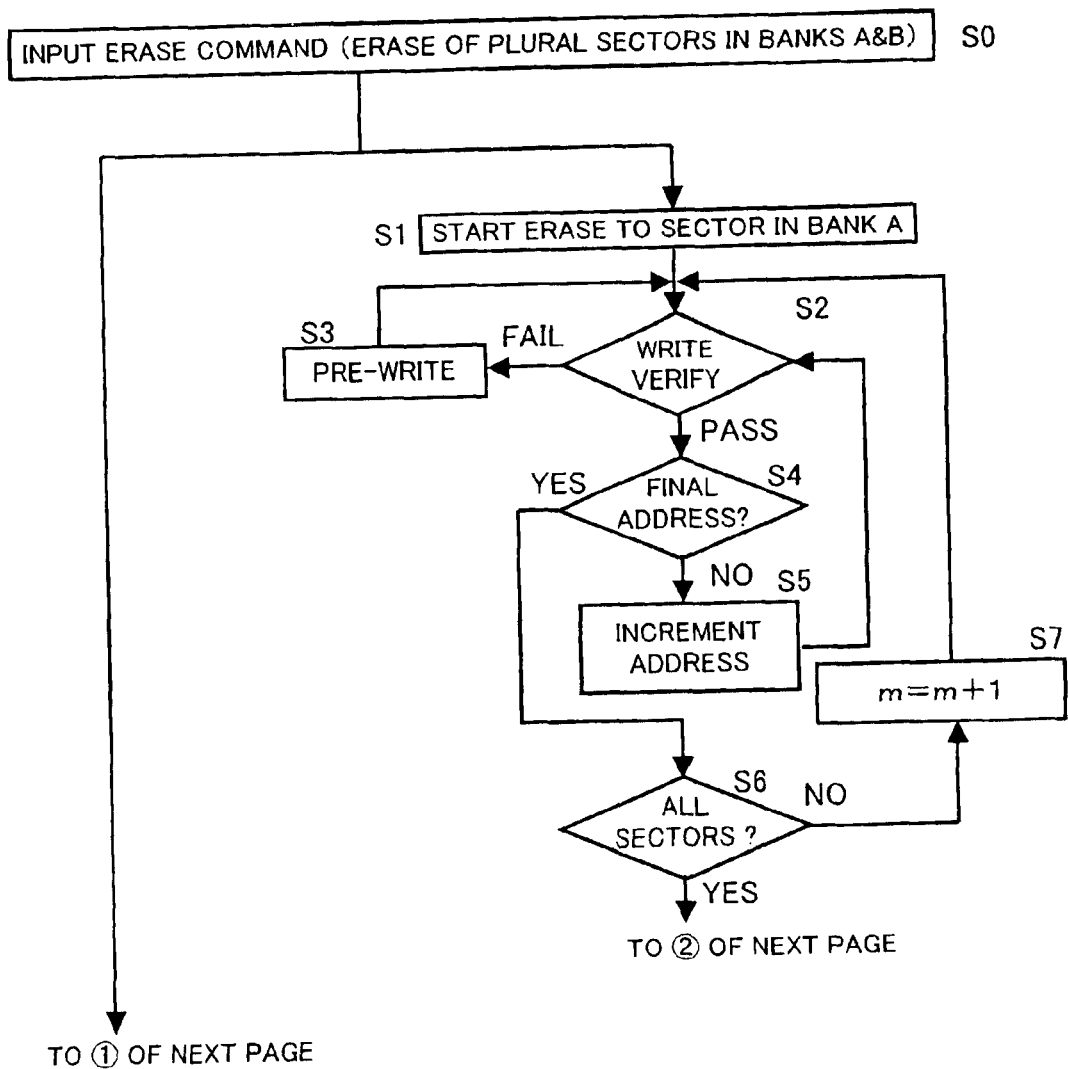
FIG. 5 is a flow chart of erasing operations for erasing sectors of banks A and B.
Figure 6:
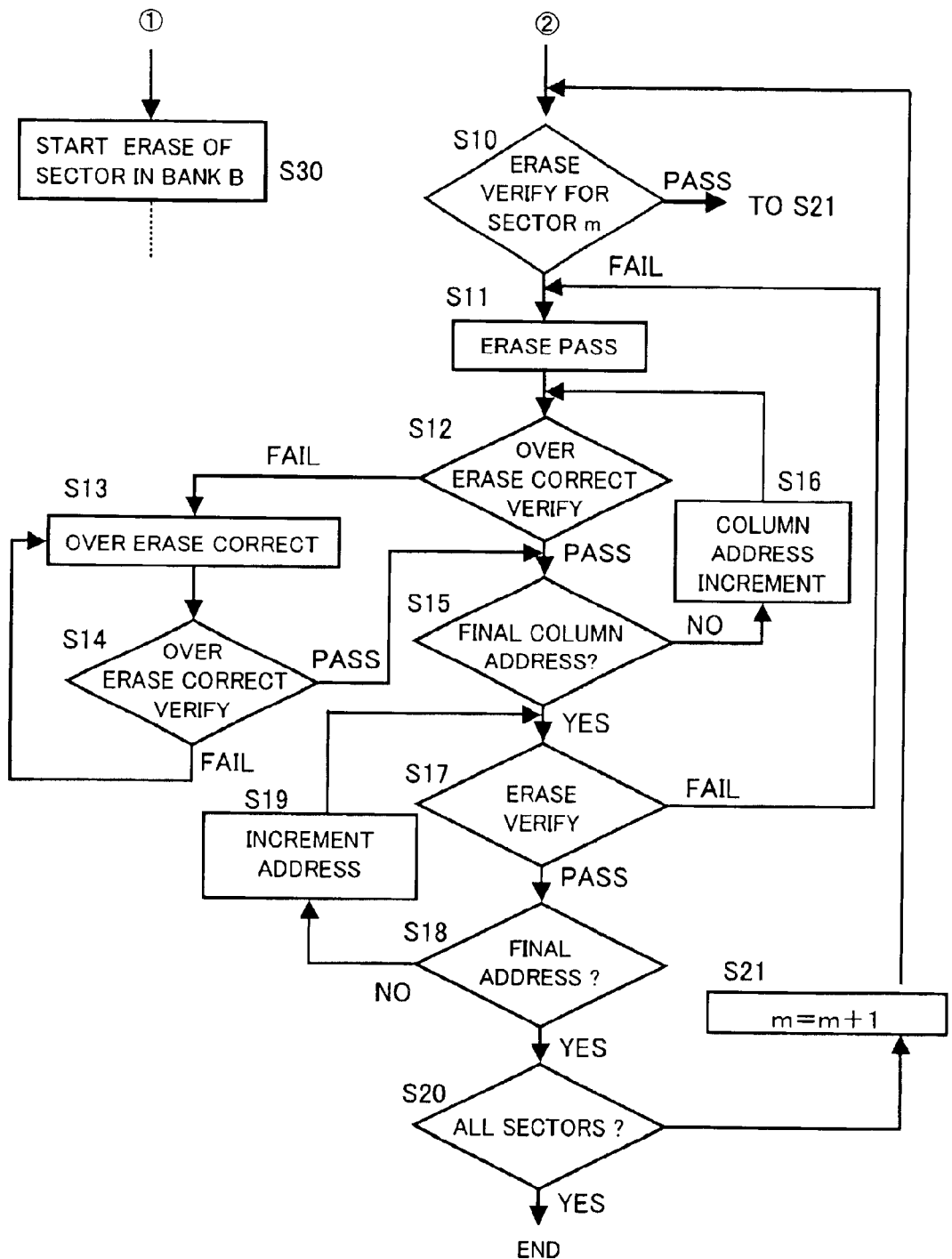
FIG. 6 is a flow chart of erasing operations for erasing sectors of banks A and B.

FIGS. 5 and 6 are flow charts of erasing operations for erasing sectors in the banks A and B. First of all, an erasing command is entered from the outside for erasing a plurality of sectors in the banks A and B (S0). In response to the erasing command, erasing operation of the specified sector in the bank A starts (S1). As described previously, erasing operation comprises a pre-writing control step to the cell transistor in the erased state which is located in the sector, and an erasing control step to all cell transistors in the sector after the pre-writing control step, and these control steps are performed by the state machine 10. Writing control includes a writing pulse apply step, and a verify step of the applied writing pulse, and erasing control comprises an erasing pulse apply step, a verify step of the applied erasing pulse, and furthermore, an over erase correct pulse apply step, and an over erase correct verify step.

When erasing operation of the sector in the bank A starts, pre-writing is performed to the cell transistor in the erased state which is located in the sector. As shown in FIG. 5, first of all, the address generator circuit ADG initializes the address in the sector, and writing verification is performed (S2). In short, whether the cell transistor is in the writing state or not is verified. If this verification fails, that means that the cell transistor is not in the writing state, so pre-writing to the cell transistor is performed accordingly (S3). To be more specific, a programming pulse of a programming voltage VPGM generated by the programming pump circuit PNP-1 is applied to the word line of the cell transistor, and an electron is injected into the floating gate or trap gate of the cell transistor.

When the cell transistor is transferred to the writing state by the application of a programming pulse (or writing pulse), writing verification is passed. This writing verify step S2 and the programming pulse application step S3 for pre-writing are repeatedly performed every time when the address generator circuit ADG increments the address (S5). When writing verification is passed up to the final address, pre-writing control in the sector ends (S4). Then, the same pre-writing control is repeatedly performed to the remaining sectors (S6, S7). At step S7, the number of sectors m is incremented, and used for checking whether all sectors finished or not. Steps S1–S7 are pre-writing control steps. When these steps ended, the cell transistors in the selected sector in the bank A are all changed into the writing state.

The flow chart continues to FIG. 6, and when pre-writing control of the selected sector in the bank A is all finished, erasing control of the sector in the bank A is performed. Steps S10–S21 shown in FIG. 6 are erasing control steps. When erasing control of the bank A starts, in parallel with this erasing control, pre-writing control in erasing operation of the sector in the bank B starts (S30). This pre-writing control is the same as shown in FIG. 5.

Erasing control of the sector in the bank A is as follows. First, erase verify step of the selected sector is performed (S10). If the cell transistors in the sector are all in the erased state, the cell transistors pass verification, and at step S21, the sector m is incremented. At the time when pre-writing is finished, the cell transistors of the sector in the bank A are in the writing state, thus the cell transistor does not pass erase verification.

Therefore, first of all, an erasing pulse is applied to all cell transistors in the sector at the same time. An erasing pulse of an erasing voltage VER generated by the erasing pump circuit PNP-2 is applied to the source or channel of the cell transistor, and to the word line (S11). To be more specific, a pulse of 9V is applied to the source or channel, and a pulse of −9V is applied to the word line, and the electron is extracted from the floating gate or trap gate. Then over erase correct process of steps S12, S13, and S14 are performed. This over erase correct process is a process of applying an automatic programming pulse after the application of an erasing pulse, for correcting an over erase state by applying a programming pulse to the cell transistor, in which the threshold voltage becomes too low due to over erase caused by the application of an erasing pulse.

In other words, an over erase correcting pulse (programming pulse) is applied to the cell transistor which failed over erase correct verification S12 (S13), such that the over erase state being corrected is verified (S14). Therefore, in this over erase correct process; a pulse is generated by the use of an over erase correct voltage VOE generated by the erasing pump circuit PNP-2.

The over erase correct verify step are performed, by checking whether a leak current occurs to the selected bit line or not, after all the word lines are controlled to the non-selection level (0V) or to slightly higher level than that, and the bit line is selected. Therefore, steps S12, S13 and S14 are performed while the column address being incremented (S15, S16).

When the over erase correct process finished, erase verification is performed (S17). This erase verification is performed by selecting of the cell transistors in the sector one by one, according to the address ADD generated by the address generator circuit ADG, and checking whether the threshold voltage of the cell transistor drops to the erased state or not. Therefore, the erase verify step S17 is performed while incrementing of the address ADD in the sector, until the cell transistor with the last address passes erase verification (S18, S19).

The application of an erasing pulse (S11) and the over erase correct processes (S12–S16) are repeatedly performed until all the cell transistors in the sector pass erase verification. When sector-erasing control finished, erasing control of a next sector is performed (S20, S21). When erasing control of all the sectors in the bank A is finished, erasing operation of the bank A is complete.

Figure 7:
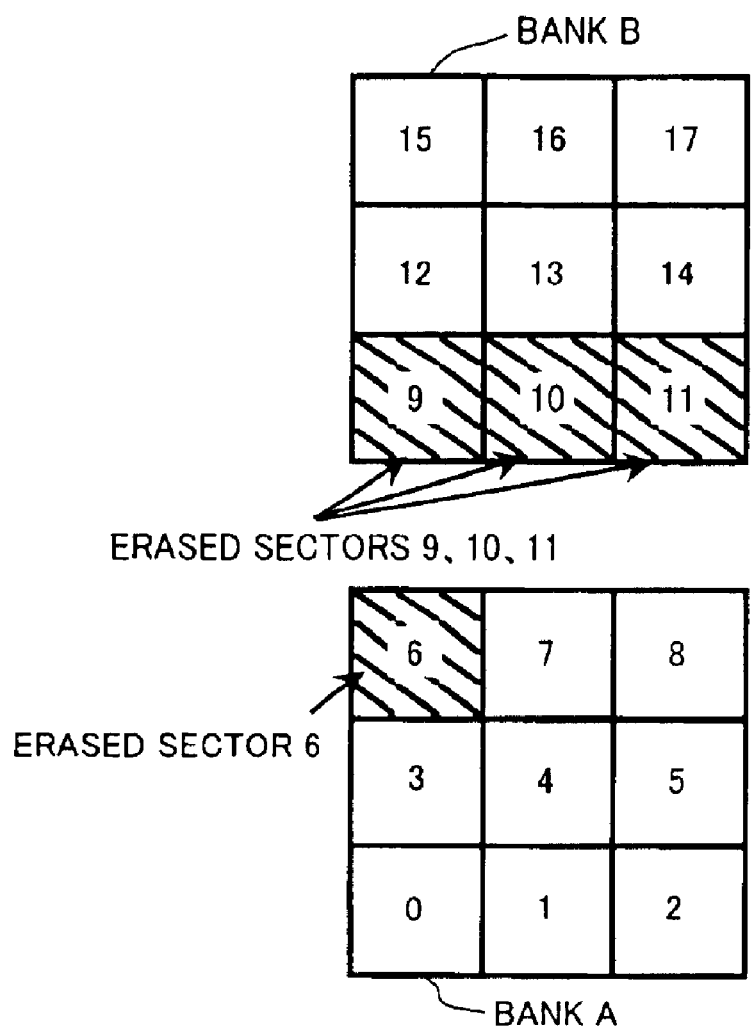
FIG. 7 is a diagram showing an example of erasing operations of a plurality of banks in the embodiment.
Figure 8:
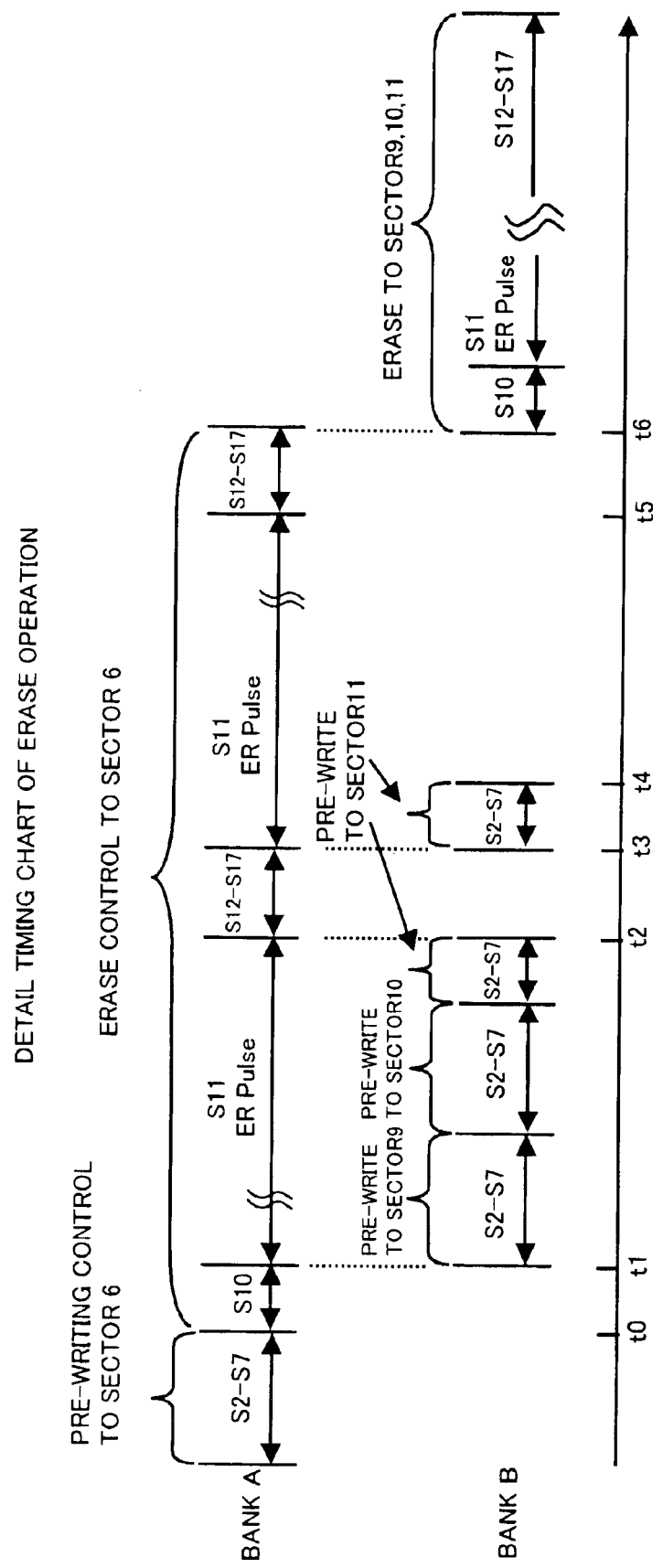
FIG. 8 is a detailed timing chart of erasing operations shown in FIG. 7.

FIG. 7 is a diagram showing an example of erasing operations of a plurality of banks according to the present embodiment. FIG. 8 is a detailed timing chart of the erasing operations. In an example shown in FIG. 7, each of a bank A and bank B has 9 sectors, respectively (sector No. 0–17), and the sector 6 of the bank A is selected as the sector to be erased, and the sectors 9, 10 and 11 of the bank B are selected as the sectors to be erased. Referring to FIG. 8, erasing operations in this case is described in detail. FIG. 8 shows, with step Nos. as shown in FIGS. 5 and 6 being given, what kind of control is performed in the bank A and bank B, respectively, along a horizontal axis representing time.

The state machine 10 as a control circuit first provides pre-writing control to the sector 6 to be erased in the bank A (S2–S7). The programming pulse application time during pre-writing control is relatively short, and all the cell transistors in the sector 6 to be erased are put into the writing state.

When pre-writing control in the bank A is finished, the erase verify process S10 to the sector 6 to be erased of the bank A is performed once, at the time t0. As described previously, at the first erase verification, verification is failed. And at time t1, an erasing pulse is applied to all the cell transistors in the sector 6 to be erased (S11), and erases control starts. In parallel with this erasing pulse application step S11, in the bank B, pre-writing control is performed to the sectors 9, 10, and 11 to be erased in that order.

FIG. 8 shows the state where pre-writing control of the sectors 9 and 10 of the bank B is completed during erase control to the sector 6 of the bank A, and further the state where erase verify steps S12–S17 of the sector 6 of the bank A take place during pre-writing control of the sector 11. In other words, the pre-writing control steps S2–S7 to the sector 11 of the bank B are performed in parallel, while an erasing pulse is being applied to the sector 6 of the bank A (S11), and when the application of an erasing pulse to the sector 6 of the bank A finishes, and the over erase correct processing and erase verify steps (S12–S17) are performed (at time t2), pre-writing control in the sector 11 is interrupted in order to use the a verify sense amplifier VSA and the address generator circuit ADG for the erase verify operation and so on.

In short, these circuits are used not only for pre-writing control, but also used for over erase correct processing after the erasing pulse application and the erase verify step. Therefore, the bank A, in which erase control is under way, and this erase control takes longer time, is given preference in using these circuits, thus pre-writing in the Bank B is interrupted.

With the interruption, at time t2, the pre-writing address in the address generator circuit ADG is temporally stored in the programming register 16. And, an erase verify address of the sector 6 of the bank A is loaded from the erasing register 18 to the address generator circuit ADG, and incrementing operation restarts. In the sector 6 of the bank A, the over erase correct processing steps S12–S17 are performed, and further the erase verify step S17 is performed while incrementing of the address.

If erase verification failed with whichever address, at time t3, the erasing pulse is re-applied to the sector 6 in the bank A (S11). In parallel with this erasing pulse re-application, pre-writing control to the sector 11 of the bank B restarts. At this time t3, the erase verify address in the address generator circuit ADG is temporally stored in the erasing register 18, and the pre-writing address in the programming register 16 is loaded to the address generator circuit ADG.

In an example shown in FIG. 8, pre-writing control steps S2–S7 to the sector 11 finished at time t4. And after that, step S11 of applying the erasing pulse to the sector 6 of the bank A, and steps S12–S17 of over erase correct processing after the erase pulse application and erase verify processing are repeatedly performed. At time t6, when the sector 6 passed erase verification up to the final address in the sector 6, the erase control to the sector 6 of the bank A finishes, and the erasing operation of the sector 6 of the bank A ends. After time T6, the erasing control is performed to the sectors 9, 10 and 11 in the bank B. This erase control is performed to the sector 9, 10 and 11, in that order. Or, the erasing control is performed to the sectors 9, 10 and 11 at the same time. The type of actual erase control differs, depending on device specs of flash memory.

As previously described, while in the bank A, an erasing pulse application is under way, a pre-writing pulse application and a verification after the erasing pulse application are sequentially performed to the memory cell in the sector to be erased in the bank B, and when verification after the erasing pulse application in the bank A is performed, verification in the sector to be erased in the bank B is interrupted, and along with this interruption, pre-writing control is interrupted. Accordingly, even if in such a configuration that only one verify sense amplifier VSA is provided in common to a plurality of banks, erasing control of erasing operation of the bank A, and pre-writing control of the bank B can be performed in parallel.

Figure 9:
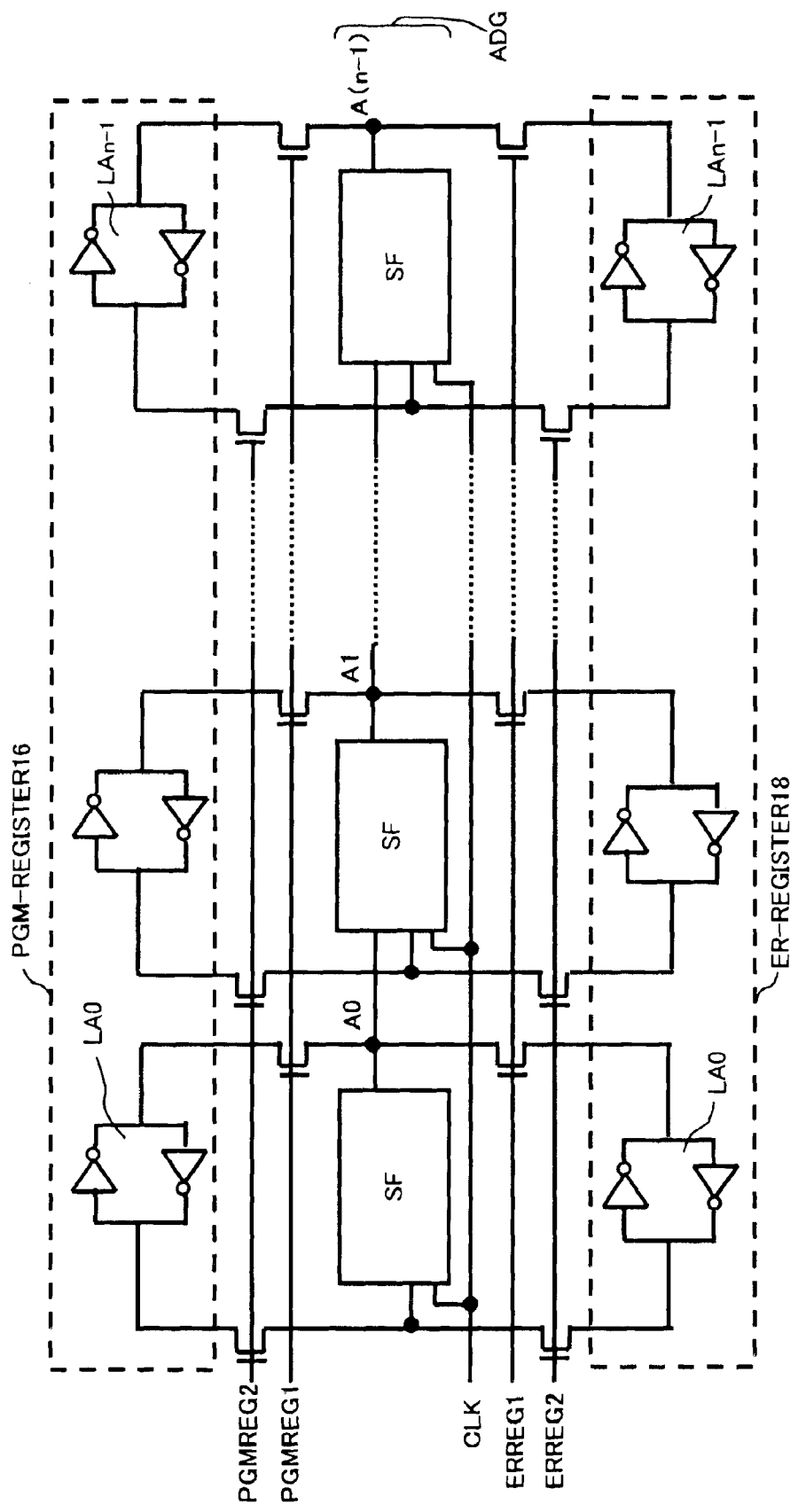
FIG. 9 is a circuit diagram showing an example of an address generator circuit in the embodiment.

FIG. 9 is a circuit diagram showing an example of an address generator circuit according to the present embodiment. The address generator circuit ADG is a counter circuit connecting a plurality of shift flip-flop SFs in a plurality of steps (n steps). The counter value A0-A(n−1) of the address generator circuit ADG is incremented, in synchronization with a clock CLK. Both of the programming register circuit 16, and the erasing register circuit 18 comprise latch circuits LA0–LAn−1 of n bits.

In response to a first programming register control signal PGMREG1 to be supplied when pre-writing control is interrupted, the address A0-A(n−1) in the address generator circuit ADG is transferred to the programming register circuit 16. Also, in response to a second programming register control signal PGMREG2 to be supplied when pre-writing control restarts, the address stored in the programming register circuit 16 is loaded to the address generator circuit ADG.

Similarly, in response to a first erasing register control signal ERREG1 to be supplied when the application of an erasing pulse starts, the address A0-A(n−1) in the address generator circuit ADG is transferred to the erasing register circuit 18. Also, in response to a second erasing register control signal ERREG2 to be supplied when erase verification restarts, the address stored in the erasing register circuit 18 is loaded to the address generator circuit ADG.

In the embodiment as described above, the address generator circuit ADG generates the writing verify address during pre-writing control, and the erase verify address during erase control, however, address generator circuits may be separately provided for generating each address, respectively. In such a case, it is not necessary to provide the registers 16 and 18 for storing the addresses.

Furthermore, the verify sense amplifier VSA is provided in common, and the erase verify processing is performed, while pre-writing control is interrupted temporarily, such that the pre-writing control process and the erase verify process are not overlapped. Also in this case, if writing verify sense amplifier and an erase verify sense amplifier are provided separately, temporary interruption of pre-writing control is not necessary.

Although the writing pump circuit and the erasing pump circuit were separately provided, a common pump circuit may be provided such that a writing voltage and an erasing voltage can be generated at the same time.

As set forth hereinabove, according to the present invention, when sectors in a plurality of banks are to be erased, the erasing time can be reduced.

What is claimed is:

1. A flash memory having a nonvolatile memory cell, comprising:

a plurality of banks each having a plurality of sectors, wherein an erasing operation for a sector to be erased includes a pre-writing control applying a writing pulse and an erasing control applying an erasing pulse thereafter, and wherein while the erasing control is provided to a sector to be erased in a first bank, the pre-writing control is provided to a sector to be erased in a second bank concurrently.

2. The flash memory according to claim 1, further comprising:

a writing voltage generator circuit for generating a voltage of the writing pulse, and an erasing voltage generator circuit for generating a voltage of the erasing pulse.

3. The flash memory according to claim 1, further comprising:

a verifier circuit for verifying an output from the sector during the pre-writing control and the erasing control, and wherein in the pre-writing control, the application of the writing pulse and subsequent verification are sequentially effected on the memory cell, and during the pre-writing control in the sector to be erased of the second bank, the pre-writing control in the second bank is interrupted when a verification after the application of the erasing pulse is performed in the sector to be erased of the first bank.

4. The flash memory according to claim 3, further comprising:

an address generator circuit for generating an address to select the memory cell during the pre-writing control, and a writing register circuit for storing the address generated by the address generator circuit, when the pre-writing control is interrupted.

5. The flash memory according to claim 1, wherein after a completion of the erasing control in the first bank, the erasing control starts in a sector to be erased in the second bank where pre-writing has ended.

6. The flash memory according to claim 1, wherein in the erasing control, an erasing pulse is applied and thereafter an erase verification is performed, in the pre-writing control, a writing pulse is applied and thereafter a writing verification is performed, and the pre-writing control in the second bank is performed during the application of the erasing pulse for the erasing control.

7. The flash memory according to claim 6, wherein when the erasing verification starts to a sector to be erased in the first bank, the pre-writing control to a sector to be erased in the second bank is interrupted.

8. A flash memory having a nonvolatile memory cell, comprising:

a plurality of banks each having a plurality of sectors, wherein an erasing operation for a sector to be erased includes a pre-writing control applying a writing pulse, and an erasing control applying an erasing pulse thereafter, and wherein while the erasing control is performed after the pre-writing control is performed to a sector to be erased in a first bank, the pre-writing control is performed to a sector to be erased in a second bank concurrently, and after the completion of the erasing control in the first bank and after the completion of the pre-writing control in the second bank, the erasing control is provided to the sector to be erased in the second bank.

9. The flash memory according to claim 8, wherein in the pre-writing control, the application of the writing pulse and the writing verification are sequentially effected on the memory cell of a sector to be erased, in the erasing control, the application of the erasing pulse is effected to the sector to be erased, with erase verification being sequentially effected to the memory cell of the sector to be erased, and during the application of the erasing pulse in the first bank, the pre-writing control is performed in the second bank, with the pre-writing control in the second bank being interrupted during the erase verification in the first bank.

10. The flash memory according to claim 9, further comprising a verifier circuit for verifying the output from the sector during the pre-writing control and the erasing control.

11. The flash memory according to claim 9, further comprising:

an address generator circuit for generating an address to select the memory cell during the pre-writing control and the erasing control;

a writing register circuit for storing the address generated by the address generator circuit when the pre-writing control is interrupted; and an erasing register circuit for storing the address generated by the address generator circuit when an erasing pulse is applied after the erase verification.

12. The flash memory according to claim 8, further comprising a writing voltage generator circuit for generating a voltage of the pre-writing pulse, and an erasing voltage generator circuit for generating a voltage of the erasing pulse.

* * * * *